US008354336B2

(12) United States Patent
Afzali-Ardakani et al.

(10) Patent No.: US 8,354,336 B2
(45) Date of Patent: Jan. 15, 2013

(54) FORMING AN ELECTRODE HAVING REDUCED CORROSION AND WATER DECOMPOSITION ON SURFACE USING AN ORGANIC PROTECTIVE LAYER

(75) Inventors: Ali Afzali-Ardakani, Ossining, NY (US); Shafaat Ahmed, Yorktown Heights, NY (US); Hariklia Deligianni, Tenafly, NJ (US); Dario L. Goldfarb, Dobbs Ferry, NY (US); Stefan Harrer, New York, NY (US); Binquan Luan, Ossining, NY (US); Glenn J. Martyna, Croton-on-Hudson, NY (US); Hongbo Peng, Chappaqua, NY (US); Stanislav Polonsky, Putnam Valley, NY (US); Stephen Rossnagel, Pleasantville, NY (US); Xiaoyan Shao, Yorktown Heights, NY (US); Gustavo A. Stolovitzky, Riverdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/820,543

(22) Filed: Jun. 22, 2010

(65) Prior Publication Data
US 2011/0312176 A1 Dec. 22, 2011

(51) Int. Cl.
*H01L 21/28* (2006.01)
*H01L 21/3205* (2006.01)
(52) U.S. Cl. .......... 438/606; 435/287.2; 435/287.1; 204/403.01; 204/403.06; 204/403.08; 204/403.07; 427/258; 205/778; 205/777.5
(58) Field of Classification Search .............. None
See application file for complete search history.

(56) References Cited

U.S. PATENT DOCUMENTS

| 4,389,371 | A | 6/1983 | Wilson et al. |
| 5,795,782 | A | 8/1998 | Church et al. |
| 6,352,838 | B1 | 3/2002 | Krulevitch et al. |
| 6,627,067 | B1* | 9/2003 | Branton et al. ........... 205/778 |
| 6,682,659 | B1* | 1/2004 | Cho et al. ................ 216/13 |
| 6,716,620 | B2 | 4/2004 | Bashir et al. |

(Continued)

FOREIGN PATENT DOCUMENTS
WO WO-0036407 6/2000
(Continued)

OTHER PUBLICATIONS

Polonsky, et al., "Nanopore in metal-dielectric sandwich for DNA position control," Applied Physics Letters, American Institute of Physics, vol. 91, No. 15, Oct. 18, 2007.

(Continued)

*Primary Examiner* — Julio J Maldonado
*Assistant Examiner* — Shantanu C Pathak
(74) *Attorney, Agent, or Firm* — Cantor Colburn LLP; Vazken Alexanian

(57) ABSTRACT

Accordingly, the present invention provides a method of forming an electrode having reduced corrosion and water decomposition on a surface thereof. A substrate which has a conductive layer disposed thereon is provided and the conductive layer has an oxide layer with an exposed surface. The exposed surface of the oxide layer contacts a solution of an organic surface active compound in an organic solvent to form a protective layer of the organic surface active compound over the oxide layer. The protective layer has a thickness of from about 0.5 nm to about 5 nm and ranges therebetween depending on a chemical structure of the surface active compound.

31 Claims, 4 Drawing Sheets

U.S. PATENT DOCUMENTS

| | | | |
|---|---|---|---|
| 6,863,833 B1* | 3/2005 | Bloom et al. | 216/2 |
| 6,905,586 B2 | 6/2005 | Lee | |
| 7,001,792 B2* | 2/2006 | Sauer et al. | 438/49 |
| 7,238,485 B2 | 7/2007 | Akeson et al. | |
| 7,279,337 B2 | 10/2007 | Zhu | |
| 7,468,271 B2* | 12/2008 | Golovchenko et al. | 435/287.2 |
| 7,625,706 B2 | 12/2009 | Akeson et al. | |
| 8,003,319 B2 | 8/2011 | Polonsky et al. | |
| 8,039,250 B2* | 10/2011 | Peng et al. | 435/287.2 |
| 2002/0088712 A1 | 7/2002 | Miles | |
| 2003/0085719 A1 | 5/2003 | Yoon et al. | |
| 2003/0161951 A1* | 8/2003 | Yuan et al. | 427/255.28 |
| 2003/0211502 A1* | 11/2003 | Sauer et al. | 435/6 |
| 2004/0011650 A1 | 1/2004 | Zenhausern et al. | |
| 2004/0163955 A1 | 8/2004 | Miles et al. | |
| 2006/0019259 A1 | 1/2006 | Joyce | |
| 2006/0057585 A1 | 3/2006 | McAllister | |
| 2006/0068401 A1 | 3/2006 | Flory | |
| 2006/0165896 A1* | 7/2006 | Afzali-Ardakani et al. | 427/258 |
| 2006/0210990 A1* | 9/2006 | Todd et al. | 435/6 |
| 2008/0129185 A1* | 6/2008 | Eden et al. | 313/485 |
| 2008/0171316 A1* | 7/2008 | Golovchenko et al. | 435/6 |
| 2008/0187915 A1* | 8/2008 | Polonsky et al. | 435/6 |
| 2009/0038938 A1 | 2/2009 | Mezic et al. | |
| 2009/0093376 A1 | 4/2009 | Wo et al. | |
| 2010/0025249 A1 | 2/2010 | Polonsky et al. | |
| 2010/0112667 A1 | 5/2010 | Sundaram et al. | |

FOREIGN PATENT DOCUMENTS

| | | |
|---|---|---|
| WO | WO-0181896 | 11/2001 |
| WO | WO-2006027780 | 3/2006 |
| WO | WO-2008092760 A1 | 8/2008 |

OTHER PUBLICATIONS

Lin, et al., "Positioning of extended individual DNA molecules on electrodes by non-uniform AC electric fields," Nanotechnology, IOP, vol. 16, No. 11, No. 1, 2005.

D. J. Branton et al., "The potential and challenges of nanopore sequencing," Nature biotechnology, vol. 26, No. 10, 2008, pp. 1146-1153.

K. Jo et al. "A single molecule barcoding system using nanoslits for DNA analysis." PNAS vol. 104, No. 8, 2007, pp. 2673-2678.

D. J. Bonnthuis et al., "Conformation and dynamics of DNA confined in slitlike nanofluidic channels," Phys. Rev. Lett., vol. 101, 2008, pp. 108303-108306.

J. J. Kasianowicz et al., "Characterization of Individual Polynucleotide Molecules Using a Membrane Channel," Proc. Natl. Acad. Sci. USA, vol. 93, 1996, pp. 13770-13773.

Z. Zou et al., "Functionalized nano interdigitated electrodes arrays on polymer with integrated microfluidics for direct bio-affinity sensing using impedimetric measurement," Sensors and Actuator A 136, 2007, pp. 518-526.

D. Fologea et al., "Slowing DNA Translocation in a Solid-State Nanopore," American Chemical Society, Nano Letters, 2005, pp. 1734-1737, vol. 5, No. 9.

J. Lagerqvist et al., "Fast DNA Sequencing via Transverse Electronic Transport," American Chemical Society, Nano Letters, 2006, pp. 779-782, vol. 6, No. 4.

U.S. Appl. No. 12/820,516, Afzali-Ardakani, et al.

U.S. Appl. No. 12/820,487, Afzali-Ardakani, et al.

U.S. Appl. No. 12/820,574, Afzali-Ardakani, et al.

Totta, "In-process intergranular corrosion in Al alloy thin films", Journal of Vacuum Science and Technology, vol. 13, Issue: 1, 1976, pp. 26-27.

Schmutz, et al., Corrosion Studies with the Atomic Force Microscope, Part I: Characterization of Potential Inhomogeneities on Passive Surfaces by Surface Potential Imaging, 2005 Veeco Instruments Inc.

WO-PCTEP08050562, May 27, 2008, search report.

J. Li et al., "Ion-Beam Sculpting at Nanometre Length Scales," Macmillan Magazines Ltd., Nature, Jul. 2001, pp. 166-169, vol. 412.

A.J. Storm et al., "Translocation of Double-Strand DNS Through a Silicon Oxide Nanopore," The American Physical Society, Physical Review, 2005, pp. 1-10, E71.

Habib, et al., "Atmospheric oxygen plasma activation of silicon (100) surfaces", Journal of Vacuum Science Technology, May/Jun. 2010.

Kakiuchi, et al., "Highly efficient oxidation of silicon at low temperatures using atmospheric pressure plasma", Appl. Phys. Lett. 90, 091909 (2007).

Han, et al., "Oxygen plasma treatment of gate metal in organic thin-film transistors," Applied Physics Letters, vol. 88, No. 23, pp. 233509-233509-3, Jun. 2006.

Park, et al., "Hybrid silicon evanescent laser fabricated with a silicon waveguide and III-V offset quantum wells", OPTICS EXPRESS, Nov. 14, 2005 / vol. 13, No. 23.

Tizazu, et al., "Photopatterning, Etching, and Derivatization of Self-Assembled Monolayers of Phosphonic Acids on the Native Oxide of Titanium", Langmuir, 2009, 25 (18), pp. 10746-10753

Tan, et al., "Self-assembled organic thin films on electroplated copper for prevention of corrosion", Journal of Vacuum Science & Technology A: Vacuum, Surfaces, and Films, Jul. 2004, vol. 22, Issue 4, pp. 1917-1925.

* cited by examiner

FORMING AN ELECTRODE HAVING REDUCED CORROSION AND WATER DECOMPOSITION ON SURFACE USING AN ORGANIC PROTECTIVE LAYER

GOVERNMENT RIGHTS

This invention was made with Government support under Contract No.: 1R01HG005110-01 awarded by the National Institute of Health. The Government may have certain rights in this invention.

CROSS-REFERENCE TO RELATED APPLICATIONS

This application is related to U.S. Patent Application 2008/0187915 filed Feb. 2, 2002, U.S. Patent Application 2010/0025249 filed Aug. 13, 2009, entitled "FORMING AN ELECTRODE HAVING REDUCED CORROSION AND WATER DECOMPOSITION ON SURFACE USING A CUSTOM OXIDE LAYER" filed on Jun. 22, 2010 having Ser. No. 12/820,487, "REDUCING CORROSION AND WATER DECOMPOSITION ON A SURFACE OF A TITANIUM NITRIDE ELECTRODE" filed on Jun. 22, 2010 having Ser. No. 12/820,574, the contents of which are incorporated herein by reference.

BACKGROUND OF THE INVENTION

The field of the present invention relates generally to thin film electrodes and, more particularly, to forming an electrode having reduced corrosion and water decomposition on the surface of the electrode.

Electrochemical corrosion of an electrode causes deterioration of the electrode and reduced functionality. Further, if the electrode is immersed in an aqueous solution and a voltage is applied, then water decomposes forming oxygen and hydrogen bubbles on the surface of an electrode.

Protecting surfaces against corrosion by coating such surfaces with an inert substance is known. The protective coating can be a layer of a metal with better protection properties than the bulk material, for example, covering iron or unalloyed steal with a layer of treated zinc. A second option is the protective coating can be an enamel layer or glass-like layer of an inorganic non-metallic material. The third option for corrosion protection is coating with an organic polymer, for example, intrinsically conducting polymers. There is a need for an improved method of inhibiting electrochemical corrosion and water decomposition on electrode surfaces.

BRIEF SUMMARY OF THE INVENTION

Accordingly, the present invention provides a method of forming an electrode having reduced corrosion and water decomposition on a surface thereof. A substrate which has a conductive layer disposed thereon is provided and the conductive layer has an oxide layer with an exposed surface. The exposed surface of the oxide layer contacts a solution of an organic surface active compound in an organic solvent to form a protective layer of the organic surface active compound over the oxide layer. The protective layer has a thickness of from about 0.5 nm to about 5 nm and ranges therebetween depending on a chemical structure of the surface active compound.

DETAILED DESCRIPTION OF THE INVENTION

Thin film electrodes are used in the emerging technology of DNA-Transistors. For a detailed explanation of DNA-Transistors see U.S. Patent Application 2008/0187915 and U.S. Patent Application 2010/0025249, both incorporated herein by reference.

Figure 1:
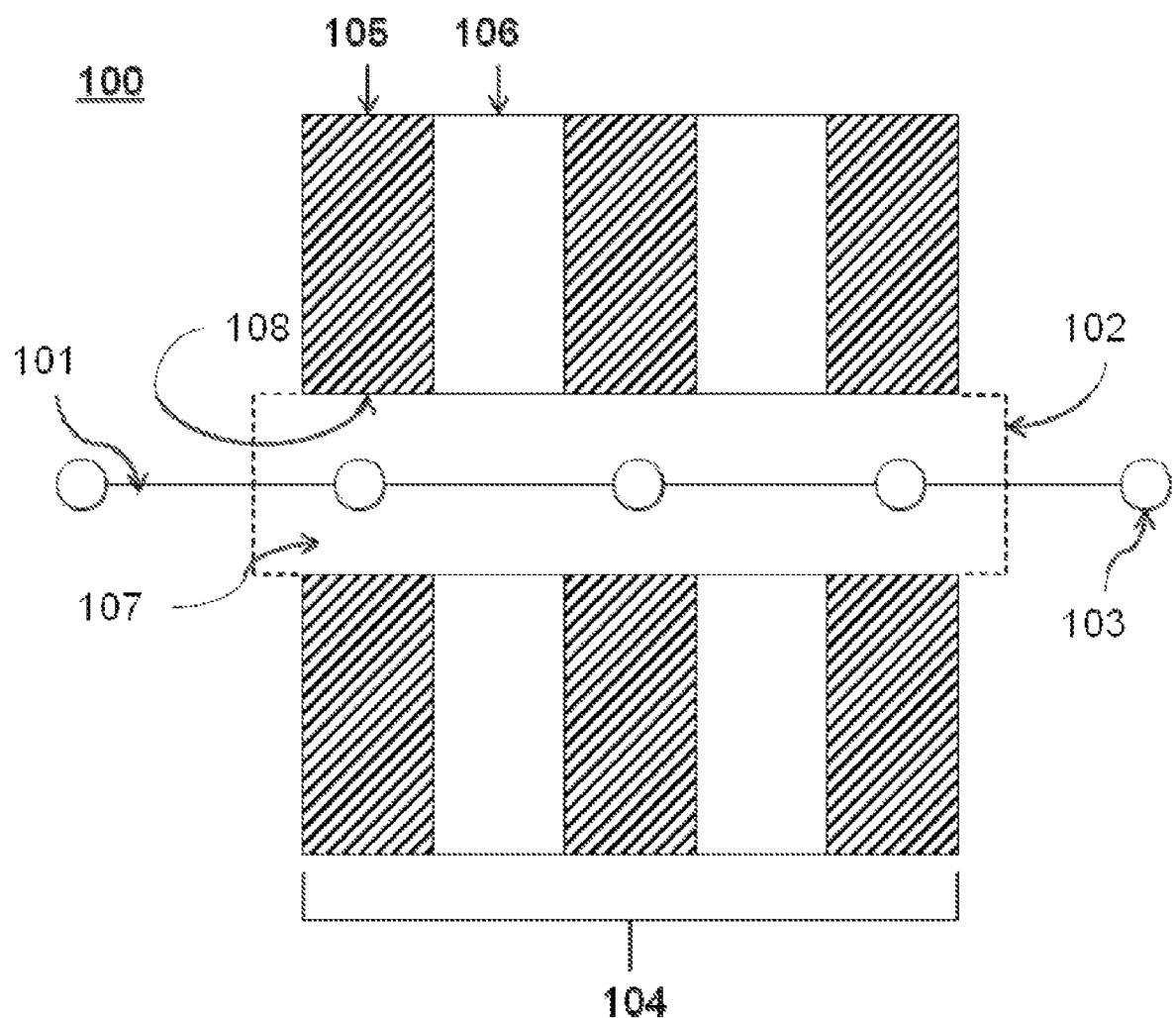
FIG. 1 shows a diagram of a DNA-Transistor device.

FIG. 1 shows a diagram of a DNA-Transistor device 100. The device 100 is capable of controlling the position of a DNA molecule 101 inside a nanopore 102 with single nucleotide accuracy. The device uses the interaction of charges 103 along the backbone of a DNA molecule 101 with an electric field created inside the nanopore 102. The nanopore 102 is drilled through a rack structure 104 of conductive layers 105 and dielectric layers 106 and then wetted with a solvent-electrolyte solution 107 carrying the DNA molecules 101. The surface areas of the conductive layers that are exposed to the solution 107 inside the nanopore 102 serve as electrodes 108 for generating and controlling the electric fields inside the nanopore 102. Voltages applied to the conductive layers 105 in the rack structure 104 allow for trapping and moving the DNA molecule 101 in the nanopore 102.

It is essential for maintaining functionality of the DNA-Transistor device 100 that the nanopore 102 dimensions are not spatially altered and continuous solution 107 flow inside the pore is not compromised during device operation. Specifically, this means that corrosion of the electrode 108 surface areas inside the nanopore 102 must be reduced and water decomposition catalyzed on the surface areas of electrodes 108 must be reduced.

Figure 2:
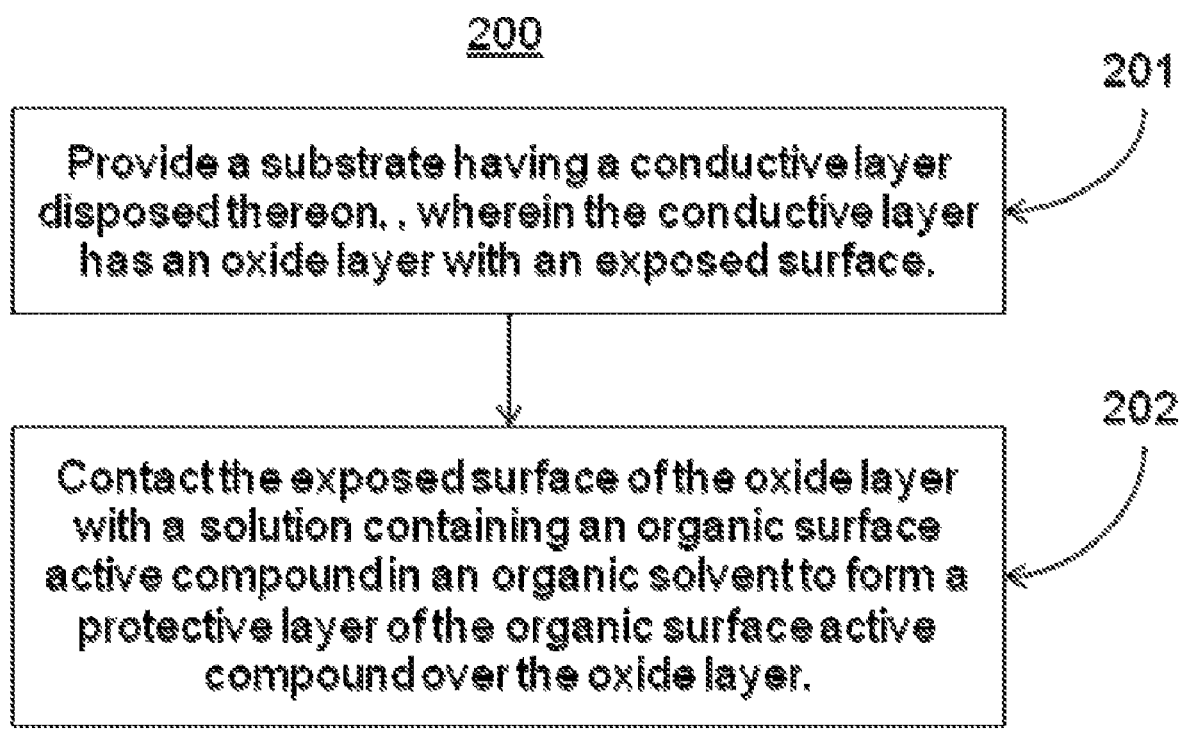
FIG. 2 shows a flow chart for a method of forming an electrode having reduced corrosion and water decomposition on a surface thereof according to an embodiment of the present invention.

FIG. 2 shows a flow chart for a method 200 of forming an electrode having reduced corrosion and water decomposition on a surface thereof according to an embodiment of the present invention. In step 201 a substrate having a conductive layer disposed thereon is provided, wherein the conductive layer has an oxide layer with an exposed surface. In step 202 the exposed surface of the oxide layer contacts a solution containing an organic surface active compound in an organic solvent to form a protective layer of the organic surface active compound over the oxide layer.

Figure 3:
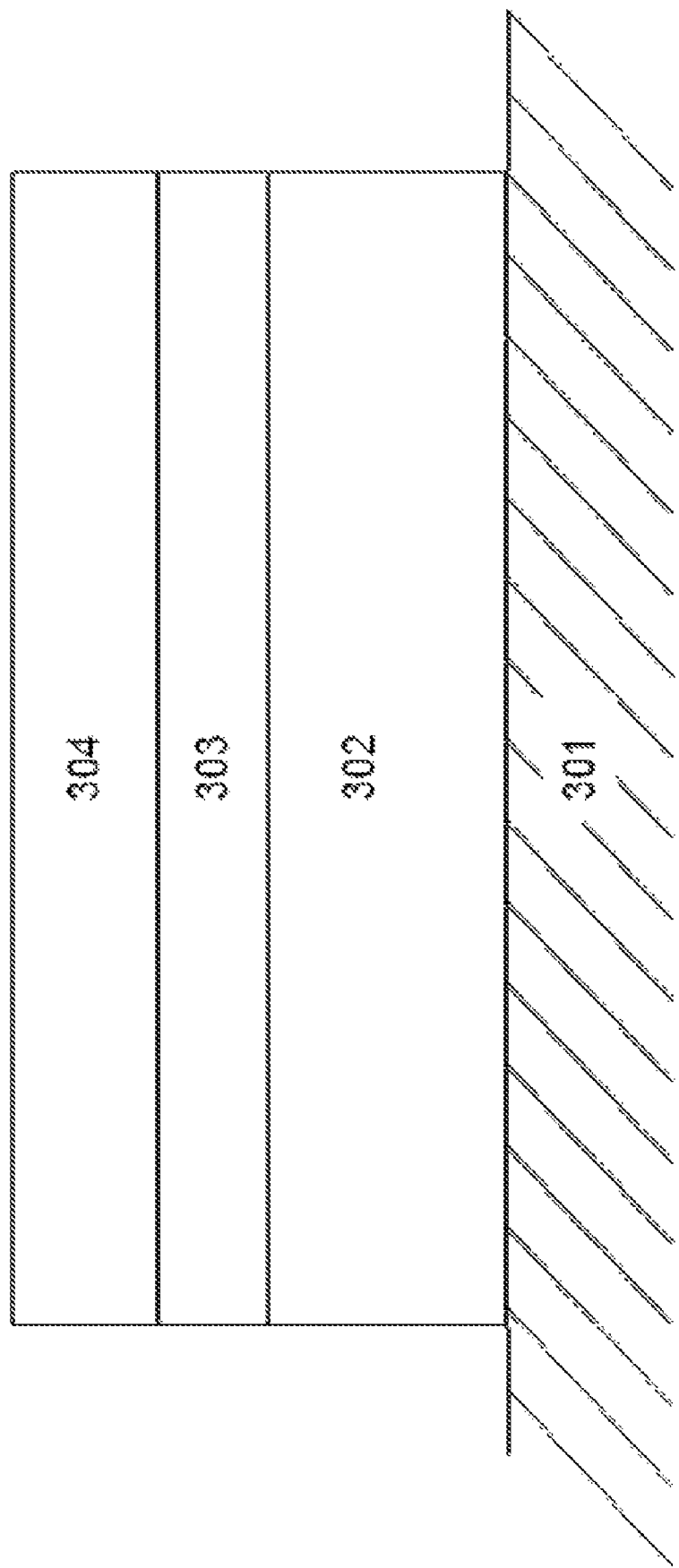
FIG. 3 shows a diagram of the electrode formed as a result of the method of an embodiment of the present invention.

FIG. 3 shows a diagram of the electrode formed as a result of the method of an embodiment of the present invention. The substrate 301 serves as the medium onto which the conductive layer 302 is deposited. An oxide layer 303 is formed on the conductive layer 302. A protective layer 304 of organic surface active compound is formed over the oxide layer 303.

The substrate 301 can be any type of common substrate material such as Kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium(IV) oxide ($CeO_2$), tin oxide ($SnO_2$), zinc titanate (Zn-$TiO_2$), AlGaAs, CN, InP, GaP, $In_{0.53}Ga_{0.47}As$, chalcogenides, a plastic material and a combination thereof.

The conductive layer 302 can be a metal, semiconductor or a doped semiconductor. Preferably, the conductive layer is titanium nitride; however, other conductive materials can be used. The conductive layer 302 can be a metal such as platinum, rhodium, gold, silver, zinc, titanium, ruthenium and aluminum. The conductive layer 302 can be a semiconductor such as GaAs, AlGaAs, NC, Ge, SiGe, InP, GaP, GaN, $In_{0.53}Ga_{0.47}As$ and chalcogenides. The chalcogenide can be a compound of a metal such as Ge, Sn, Pb, Sb, Bi, Ga, In, TI and a combination thereof and a chalcogen such as S, Se, Te and a combination thereof. The conductive layer 105 can also be a doped semiconductor such as aluminum doped zinc oxide, phosphorus doped silicon, boron doped silicon, lanthanum doped zirconium dioxide, scandium doped zirconium dioxide, and yttrium doped zirconium dioxide. The conductive layer 302 can be deposited by any deposition process such as sputtering, molecular beam epitaxy, ion beam lithography and atomic layer deposition.

The oxide layer 303 can be formed through any known method of oxidation; however, preferably the oxidation is carried out by plasma oxidation in order to create an ultra-thin oxide layer 303. A preferred custom oxygen plasma process uses a working pressure of 150 mT, an oxygen flow rate of 100 sccm, a power of 40-200 W and a time of 0-80 seconds. The custom process provides a uniform oxide layer 303 free of surface defects. The thickness of the oxide layer 303 can be reduced to a thickness of 0.09 nm with a precision of 0.2 nm. It is beneficial that the oxide layer 303 be ultra-thin and highly uniform in application inside a nanopore. The custom oxygen plasma process can be applied not only to planar surfaces but also to topographically patterned surfaces isotropically oxidizing angled and vertical sidewalls as found inside a nanopore.

The protective layer 304 is formed by self assembly of an organic surface active compound. The organic surface active compound has a structure which includes a polar end and a non-polar end. The polar end of the organic surface active compound forms a hydrogen bond with oxygen of the oxide layer 303 and the non-polar end forms the protective layer 304.

Preferably the protective layer 304 is a highly compact self assembled monolayer of a long chain organic phosphonic acid or hydroxamic acid. More specifically, the preferred organic surface active compound is represented by the formula:

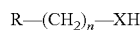

wherein R is an alkyl group of 1-4 carbon atoms; n is from 0 to about 18; and —XH is a moiety selected from the group consisting of: —CONHOH, —COOH, —$SO_2$OH, —SOON, —$SO_2$NHOH, —$P(O)_2$NHOH, —$P(O)_2$OH, —$PO_3$H, and mixtures thereof. The alkyl chains of phosphnoic or hyroxamic acids can also be partically or fully fluorinated to impart yet higher hydrophobicity on the exposed surface.

Figure 4:
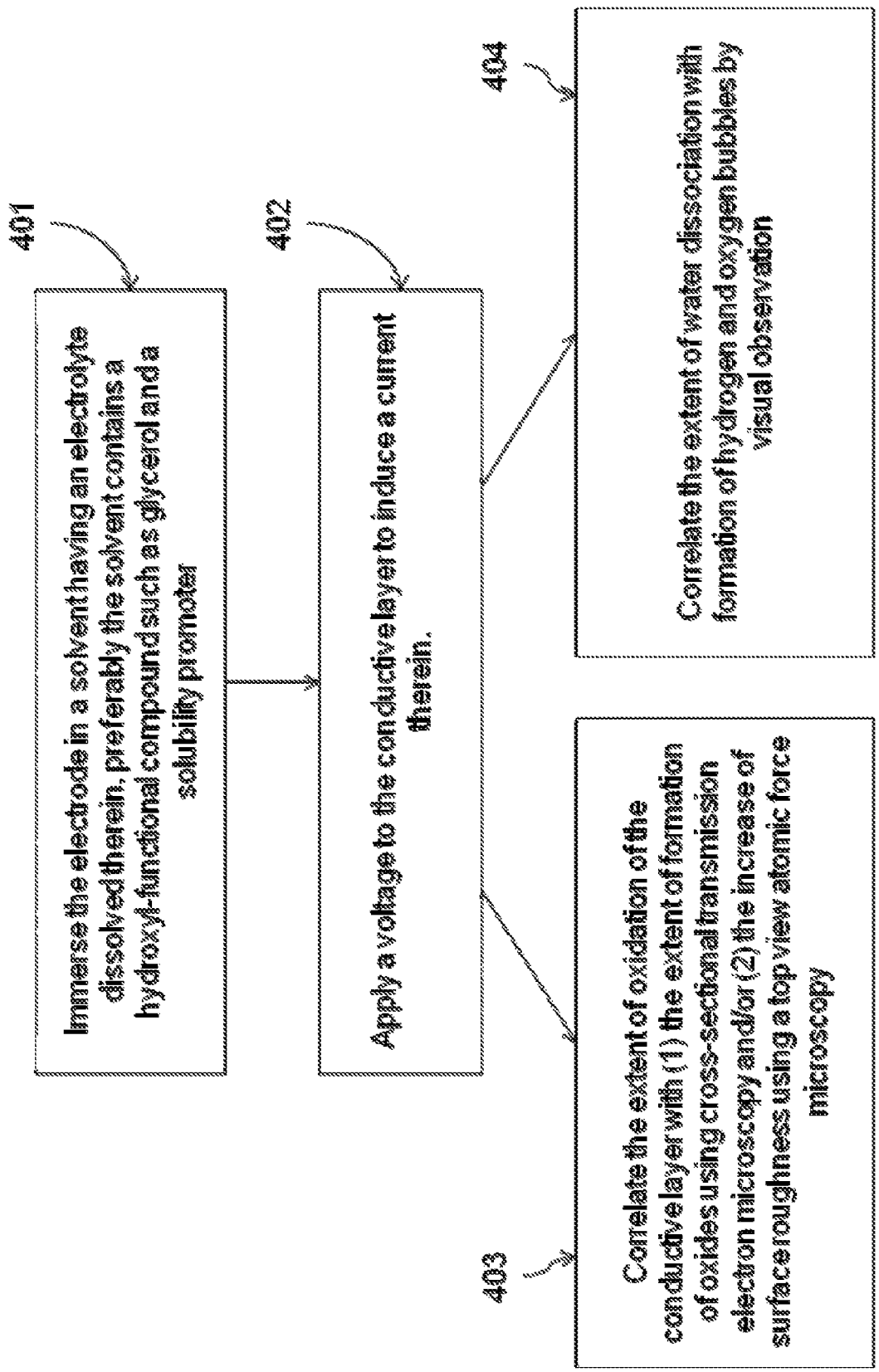
FIG. 4 shows a flow chart for a method of inhibiting corrosion and water decomposition on an electrode surface according to an embodiment of the present invention.

FIG. 4 shows a flow chart for a method of inhibiting corrosion and water decomposition on an electrode surface according to an embodiment of the present invention.

In step 401 the electrode is immersed in a solvent having an electrolyte dissolved therein. Preferably, the solvent is an organic solvent such as methanol, ethanol, propanol, butanol, ethylene glycol, ethyl acetate, 1,2-propanediol, 1,3-propanediol, diethyl ether, methyl ethyl ketone, methoxyethyl acetate, methoxypropyl acetate, methylene chloride, acetone, aliphatic hydrocarbons, aromatic hydrocarbons, and mixtures thereof.

In order to inhibit corrosion and water decomposition, the solvent contains a hydroxyl-functional compound such as a linear, branched, or cyclic alcohol of 1 to 6 carbon atoms, ethylene glycol, propylene glycol, butane diol, pentane diol, hexan diol, polyethylene glycol, glycerol, trimethylol ethane, trimethylol propane, isomers thereof, aqueous solutions thereof, and mixtures any of the preceding hydroxyl-functional compounds. Preferably, the solution containing hydroxyl-functional compound has a viscosity from about 1 centi Stokes (cSt) to about 250 centi Stokes.

Further, preferably the solvent also contains a solubility promoter such as dimethylsulfoxide, N,N-dimethylformaide, N,N-dimethylacetamaide, tri(dimethylamino)phosphine, tri(dimethylamino)phosphoramide, ethyl acetate, diethyl ether, methyl ethyl ketone, methoxyethyl acetate, methoxypropyl acetate, methylene chloride, acetone, and mixtures thereof.

The electrolyte dissolved in the solvent can be a salt, an ammonium salt, a quaternary ammonium salt, a substantially dissociated compound, ionic liquids, and mixtures thereof. The electrolyte is preferably at a concentration from about 0.001 weight percent to about 10 weight percent.

In step 402 a voltage is applied to the conductive layer to induce a current therein. The current can be either AC or DC current.

In step 403 the extent of oxidation of the conductive layer is measured. Preferably, this is carried out by using cross-sectional transmission electron microscopy, cross-section scanning electron microscopy and/or using a top view atomic force microscopy.

In step 404 the extent of water decomposition is measured by visually observing the formation of hydrogen and oxygen bubbles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming an electrode comprising:
forming a rack structure of alternating dielectric layers and conductive layers above a substrate;
forming a nanopore through said substrate and said rack structure, wherein a wall defining the nanopore includes exposed surfaces corresponding to the alternating dielectric layers and conductive layers;
forming an oxide layer on the exposed surfaces of the conductive layers;
contacting said oxide layer with a solution of an organic surface active compound to form a protective layer on said oxide layer, thereby forming an electrode having reduced corrosion and water decomposition;
wherein said protective layer has a thickness of from about 0.5 nm to about 5 nm and ranges therebetween;
wherein said surface active compound has a structure that includes a polar end and a non-polar end.

2. The method of claim 1, wherein said protective layer is formed by self assembly of said surface active compound.

3. The method of claim 1, wherein said polar end of said surface active compound forms a hydrogen bond with oxygen of said oxide layer and said non-polar end forms said protective layer.

4. The method of claim 3, wherein said protective layer is a monolayer.

5. The method of claim 1, wherein said surface active compound is represented by the formula:

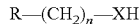

wherein R is an alkyl group of 1-4 carbon atoms; n is from 0 to about 18; and —XH is a moiety selected from the group consisting of: —CONHOH, —COOH, —SO$_2$OH, —SOOH, —SO$_2$NHOH, —P(O)$_2$NHOH, —P(O)$_2$OH, —PO$_3$H, and mixtures thereof.

6. The method of claim 1, wherein said conductive layers comprise a material selected from the group consisting of a metal, semiconductor, and a doped semiconductor.

7. The method of claim 6, wherein said metal is selected from the group consisting of titanium nitride, platinum, rhodium, gold, silver, zinc, titanium, ruthenium, and aluminum.

8. The method of claim 6, wherein said semiconductor is selected from the group consisting of GaAs, AlGaAs, NC, Ge, SiGe, InP, GaP, GaN, and In$_{0.53}$Ga$_{0.47}$As and chalcogenides.

9. The method of claim 8, wherein said metal chalcogenide comprises a metal selected from the group consisting of Ge, Sn, Pb, Sb, Bi, Ga, In, Tl and a combination thereof and a chalcogen selected from the group consisting of S, Se, Te and a combination thereof.

10. The method of claim 6, wherein said doped semiconductor is selected from the group consisting of aluminum doped zinc oxide, phosphorus doped silicon, boron doped silicon, lanthanum doped zirconium dioxide, scandium doped zirconium dioxide, and yttrium doped zirconium dioxide.

11. The method of claim 1, wherein said conductive layers are deposited by a method selected from the group consisting of: sputtering, molecular beam epitaxy, ion beam lithography, and atomic layer deposition.

12. The method of claim 1, wherein said oxide layer is formed by oxidation of said conductive layer is carried out by plasma oxidation.

13. The method of claim 1, further comprising applying a voltage to said conductive layers.

14. The method of claim 1, wherein a current is applied to said conductive layer.

15. The method of claim 14, wherein said current is selected from the group consisting of: AC and DC currents.

16. The method of claim 1, wherein said substrate is selected from the group consisting of:
Kapton, silicon, amorphous hydrogenated silicon, silicon carbide (SiC), silicon dioxide (SiO$_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride (Si$_3$N$_4$), alumina (Al$_2$O$_3$), cerium(IV) oxide (CeO$_2$), tin oxide (SnO$_2$), zinc titanate (ZnTiO$_2$), AlGaAs, CN, InP, GaP, In$_{0.53}$Ga$_{0.47}$As, chalcogenides, a plastic material and a combination thereof.

17. The method of claim 1, wherein said conductive layers in the rack comprises a plurality of same or different individual conductive layers.

18. The method of claim 1, wherein said oxide layer has a thickness from about 0.09 nm to about 1.0 nm.

19. The method of claim 18, wherein said oxide layer has a thickness from about 0.09 nm to about 0.6 nm.

20. The method of claim 19, wherein said oxide layer is a monolayer.

21. The method of claim 1, wherein said solution further comprises an organic solvent selected from the group consisting of methanol, ethanol, propanol, butanol, ethylene glycol, ethyl acetate, 1,2-propanediol, 1,3-propanediol, diethyl ether, methyl ethyl ketone, methoxyethyl acetate, methoxypropyl acetate, methylene chloride, acetone, aliphatic hydrocarbons, aromatic hydrocarbons, and mixtures thereof.

22. The method of claim 1, further comprising:
prior to applying a voltage to said conductive layer, immersing said electrode into a solution containing a hydroxyl-functional compound.

23. The method of claim 22, wherein a current is applied to said conductive layers.

24. The method of claim 23, wherein said current is selected from the group consisting of AC and DC currents.

25. The method of claim 22, wherein said hydroxyl-functional compound is selected from the group consisting of a linear, branched, or cyclic alcohol of 1 to 6 carbon atoms, ethylene glycol, propylene glycol, butane diol, pentane diol, hexan diol, polyethylene glycol, glycerol, trimethylol ethane, trimethylol propane, isomers thereof, aqueous solutions thereof, and mixtures any of the preceding hydroxyl-functional compounds.

26. The method of claim 25, wherein said hydroxyl-functional compound further comprises a solubility promoter selected from the group consisting of dimethylsulfoxide, N,N-dimethylformaide, N,N-dimethylacetamaide, tri(dimethylamino)phosphine, tri(dimethylamino)phosphoramide, ethyl acetate, diethyl ether, methyl ethyl ketone, methoxyethyl acetate, methoxypropyl acetate, methylene chloride, acetone, and mixtures thereof.

27. The method of claim 25, further comprising dissolving an electrolyte in said solution containing a hydroxyl-functional compound.

28. The method of claim 27, wherein said electrolyte is a salt, an ammonium salt, a quaternary ammonium salt, a substantially dissociated compound, ionic liquids, and mixtures thereof.

29. The method of claim 28, wherein said electrolyte is at a concentration from about 0.001 weight percent to about 10 weight percent.

30. The method of claim 29, wherein said solution containing a hydroxyl-functional compound has a viscosity from about 1 centi Stokes (cSt) to about 250 centi Stokes.

31. The method of claim 22, further comprising:
applying a voltage to one or more of said conductive layers; and
correlating at least one of
(i) extent of further oxidation of a titanium nitride conductive layer with extent of formation of oxides of titanium nitride using cross-sectional transmission electron microscopy;
(ii) extent of further oxidation of said titanium nitride conductive layer with extent of increase of surface roughness of said conductive layer using top view atomic force microscopy; and
(iii) water decomposition with formation of hydrogen and oxygen bubbles by visual observation.

* * * * *